United States Patent [19]

Shichijo

[11] Patent Number: 4,910,164
[45] Date of Patent: Mar. 20, 1990

[54] METHOD OF MAKING PLANARIZED HETEROSTRUCTURES USING SELECTIVE EPITAXIAL GROWTH

[75] Inventor: Hisashi Shichijo, Garland, Tex.

[73] Assignee: Texas Instruments Incorporated, Dallas, Tex.

[21] Appl. No.: 224,965

[22] Filed: Jul. 27, 1988

[51] Int. Cl.⁴ .............................................. H01L 21/20
[52] U.S. Cl. ............................ 437/90; 148/DIG. 26; 148/DIG. 72; 148/DIG. 100; 156/610; 437/99; 437/132; 437/944
[58] Field of Search .................... 148/DIG. 26, 50, 56, 148/65, 72, 97, 100, 104, 110, 149, 169, 33-33.4; 156/610-614; 427/248.1, 252, 255.1; 437/81, 89, 90, 105, 99, 126, 132, 946, 944, 976

[56] References Cited

U.S. PATENT DOCUMENTS

| 3,322,581 | 5/1967 | Hendrickson et al. | 437/111 |
| 3,401,449 | 9/1968 | Shaw | 437/90 |
| 3,764,409 | 9/1969 | Nomura et al. | 437/110 |
| 4,727,047 | 2/1988 | Bozler et al. | 437/89 |

OTHER PUBLICATIONS

Li et al., "Aspects of GaAs Selective Area Growth ...", J. Electrochem. Soc., vol. 130, No. 10, Oct. 1983, pp. 2072-2075.
Matyi et al., "Patterned Growth of Gallium Arsenide on Silicon", J. Vac. Sci. Technol, B6 (2), Mar./Apr. 1988, pp. 699-702.
Aizhen et al., "Selective Area MBE Technique for GaAs ...", J. Vac. Sci. Tech., B3 (2), Mar./Apr. 1985, pp. 746-749.
Hong et al., "Summary Abstract: Selective—Area Epitaxy of GaAs ...", J. Vac. Sci. Technol., B4 (2), Mar./Apr. 1986, pp. 629-630.

Primary Examiner—Brian E. Hearn
Assistant Examiner—William Bunch
Attorney, Agent, or Firm—Melvin Sharp; James T. Comfort; Carl H. Hoel

[57] ABSTRACT

A lift-off method for forming regions of a first semiconductor such as GaAs (104) in recesses in a substrate of a second semiconductor such as silicon (102) with the surface of the first semiconductor region (104) coplanar with the surface of the second semiconductor layer (102). Also, interconnected devices in both regions. Preferred embodiment methods include growth by molecular beam epitaxy of a layer of the first semiconductor on a masked and recessed substrate of the second semiconductor followed by photolithographic removal of the grown layer outside of a neighborhood of the recesses and lift-off (by mask etching) of the remainder of the grown layer outside of the recesses.

15 Claims, 5 Drawing Sheets

METHOD OF MAKING PLANARIZED HETEROSTRUCTURES USING SELECTIVE EPITAXIAL GROWTH

CROSS-REFERENCE TO RELATED APPLICATIONS copending U.S. application Ser. Nos. 094,231, pending filed 9/8/87 (TI-12996 Matyi and Schichijo), and 912,028, pending filed 9/26/86 (TI-11910 Lee) disclose related subject matter. These cross-referenced applications are assigned to the assignee of this application.

BACKGROUND OF THE INVENTION

1. Field of the Invention

The present invention relates to growth of semiconductor materials and devices, and more particularly, to heteroepitaxial growth of a first semiconductor (such as gallium arsenide) on a masked second semiconductor (such as silicon dioxide masked silicon) and devices in such heterostructures.

2. Description of the Relates Art

Many researchers have investigated growth of semiconductordevice quality gallium arsenide (GaAs) on silicon wafers and fabrication of active devices in the GaAs. Such devices would combine the higher mobility of carriers in GaAs with the greater mechanical strength and thermal conductivity of a silicon substrate. For example, R. Fischer et al., GaAs/AlGaAs heterojunction Bipolar Transistors on Si Substrates, 1985 IEDM Tech. Digest 332, report GaAs/AlGaAs heterojunction bipolar transistors grown on silicon substrates and having current gains of $\beta=13$ for a 0.2 $\mu$m thick base. Similarly, G. Turner et al, Picosecond Photodetector Fabricated in GaAs Layers Grown on Silicon and Silicon On Sapphire Substrates, 1985 IEDM Tech. Digest 468, report response times of 60 picoseconds for photoconductive detectors fabricated in GaAs on silicon. These articles also note that majority carrier devices such as MESFETs fabricated in GaAs on silicon have performance approaching that of homoepitaxial devices; and this has encouraged efforts to integrate GaAs/AlGaAs optoelectronic and high-frequency devices and silicon devices on the same wafer to utilize high-data-rate optical interconnections to reduce the number of wire interconnections. Selective recrystallization of amorphous GaAs can use the high resistivity of noncrystalline GaAs; see, for example, A. Christou et al., Formation of (100) GaAs on (100) Silicon by Laser Recrystallization, 48 Appl. Phys. Lett. 1516 (1986).

One of the principal reasons for the increasing activity in the epitaxial growth of GaAs on silicon substrates is the prospect of monolithic integration of GaAs and Si devices in the same structure. In order to achieve this goal, however, it will be necessary to develop materials growth and device processing techniques that will permit the coexistance of circuit elements with vastly different fabrication requirements. One of the most promising of these approaches is the patterned growth of GaAs onto a silicon substrate through openings in a protective mask of either silicon nitride ($Si_3N_4$) or silicon dioxide ($SiO_2$). In this scheme, the fabrication of the silicon based devices (which typically require high temperature processing) would be completed prior to the deposition of a protective oxide or nitride overlayer. Single crystal GaAs could then be grown into lithographically defined holes in the overlayer, and GaAs device fabrication would follow.

Previous work has established that epitaxial GaAs can be successfully deposited onto silicon substrates through a patterning mask; see B. Y. Tsaur et al., 41 Appl Phys. Lett. 347 (1982), P. Sheldon et al., 45 Appl. Phys. Lett. 274 (1984), Daniele et al., U.S. Pat. No. 4,587,717, and Betsch et al., U.S. Pat. No. 4,551,394. In addition, the integration of Si and GaAs device structures via this technology has been demonstrated; see H. K. Choi et al., 7 IEEE Elec. Dev. Lett 241 and 500 (1986) and H. K. Choi et al., Heteroepitaxy on Silicon, J. C. C. Fan and J. M. Poate Eds., 67 MRS Symposia Proceedings 165 (1986).

It is now well established that the differences in lattice parameters and thermal expansion coefficients that can limit the performance of GaAs devices. This situation would be exacerbated when the GaAs is deposited through holes in a mask onto a silicon surface by molecular beam epitaxy (MBE). Due to the nonselective nature of MBE growth, the single crystal GaAs regions would be in intimate contact with the polycrystalline GaAs that would grow on the amorphous mask material. The presence of this extra defective interface would naturally be expected to serve as a source for addition crystallographic defects. Similar effects are expected with other growth methods such as metalorganic chemical vapor deposition (MOCVD).

The simplest avenue for the patterned growth of GaAs on Si would involve the epitaxial growth of the GaAs onto the original planar silicon surface. however, the final level of the GaAs surface where device fabrication occurs may be several microns above the the level of prefabricated silicon devices. This situation would naturally complicate the interconnect of the two devices structures by conventional metallization schemes. Indeed, for integrated circuits with both digital silicon and digital GaAs devices on an underlying silicon substrate, the coplanarity between the surface of the GaAs regions and the surface of the silicon substrate is essential. One method to achieve this coplanarity is by forming recesses in the silicon substrate where the GaAs regions are to be located and then growing a GaAs layer until the surface of the GaAs in the recesses is coplanar with the surface of the silicon substrate outside of the recesses. Typically the recesses will be about two to three microns deep; see FIG. 1 for a cross sectional elevation view in which the recess was defined by an silicon dioxide (oxide) mask and a layer of GaAs grown by molecular beam epitaxy (MBE) without removal of the oxide mask. The portion of the GaAs layer over the silicon substrate grows as a single crystal beyond a thin dislocation region along the interface, whereas the portion of the GaAs layer over the oxide mask grows as polycrystalline GaAs.

In order to complete a coplanar GaAs in recesses in a silicon substrate, the polycrystalline GaAs in FIG. 1 must be removed without affecting the single crystal GaAs in the recess. The standard method is photolithography: apply photoresist and pattern it to just cover the single crystal GaAs in the recess; then etch off the polycrystalline GaAs using the patterned photoresist as the etch mask. however, this has an alignment problem for the patterned photoresist mask, which is aggravated by the step in the GaAs layer at the recess edge. In particular, if the patterned photoresist mask is offset or of the wrong size, then either the single crystal GaAs is eroded or not all of the polycrystalline GaAs is removed (or both) which disrupts coplanarity. FIG. 2 shows both the groove in the single crystal GaAs at a recess edge and the polycrystalline GaAs strip at another recess edge resulting from an offset mask; the groove can be as deep as two microns and the strip can be as high as two or three microns. Both the groove and the strip are incompatible with standard metal interconnection processing.

Thus the known planarization methods for GaAs regions in a silicon substrate have the problems of grooves in the GaAs and strips of GaAs at the interface with the silicon.

Selective epitaxial growth of heavily-doped regions of GaAs in recesses of an essentially undoped GaAs substrate by MBE with a lift-off process is known. The heavily-doped regions could be the source and drain regions for a FET. See A. Cho et al., Selective Lift-Off for Preferential Growth with Molecular Beam Epitaxy, 24 IEEE Tr.Elec.Dev. 1186 (1977).

SUMMARY OF THE INVENTION

The present invention provides heteroepitaxial structures of a first semiconductor (e.g., GaAs) in recesses of a second semiconductor (e.g., silicon) yielding a planar product and integrated circuits with devices of both the first semiconductor and the second semiconductor on the same chip. The invention also provides a method of heteroepitaxy by the steps of deposition of a layer of the first semiconductor on a masked and recessed substrate of the second semiconductor followed by removal of the layer except in the neighborhood of the recesses and then removal of the remaining portions of the layer not located in the recesses by lift-off with the mask or ultrasonic rinse. Thus the method is "self-aligned" in that the removal of the layer is aligned to the recesses.

This method yields regions of the first semiconductor material in the recesses of the second semiconductor substrate with the surfaces of the regions and the substrate being coplanar and the self-alignment avoids the problems of the known GaAs regions in a silicon substrate methods.

BRIEF DESCRIPTION OF THE DRAWINGS

The drawings are schematic for clarity.

DESCRIPTION OF THE PREFERRED EMBODIMENTS

FIGS. 3a–d illustrate in cross sectional elevation view steps of the first preferred embodiment method of formation of single crystal GaAs regions 104 in recesses in single crystal silicon substrate 102 as follows.

Figure 1:
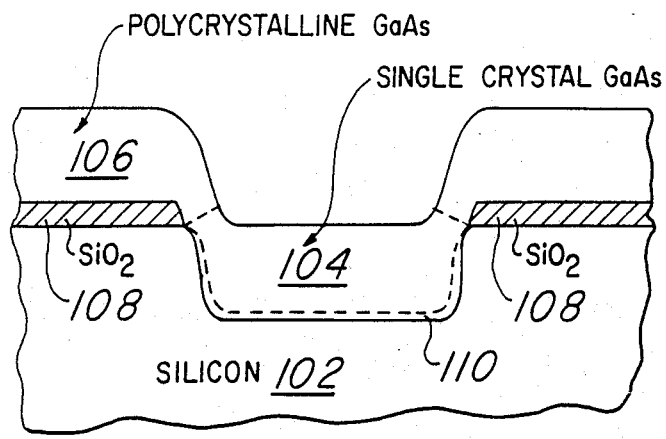
FIG. 1 is a cross sectional elevation view of a prior art deposition of GaAs on recessed and masked silicon.
Figure 2:
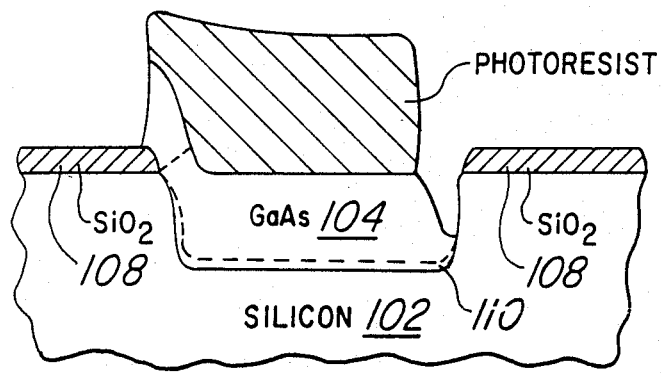
FIG. 2 is a cross sectional elevation view of problems of prior art planarization of GaAs deposited on recessed and masked silicon.

(a) Begin with silicon substrate 102 which is a silicon wafer four inches in diameter, oriented in the (100) direction, and doped p−. Note that substrate 102 may contain various devices such as MOS and bipolar transistors and interconnections for such devices away from the regions where GaAs is to be deposited. Deposit 3,000 Å of silicon dioxide (oxide) 108 on the surface of substrate 102, spin photoresist onto oxide 108, and pattern (expose through a mask and develop) the photoresist to define the locations for recesses in substrate 102. The recesses may be of any convenient sizes and shapes, such as 200 μm squares. Etch oxide 108 and substrate 102 by reactive ion etching with the patterned photoresist as etch mask; this forms recesses with substantially vertical sidewalls to a depth of about two or three microns, depending upon application. Strip the photoresist and grow a layer of GaAs on the oxide 108 coated and recessed surface of substrate 102; the layer of GaAs has a thickness equal to the depth of the recesses (two or three microns), although a thickness difference of one or two tenths micron will not overly disrupt the planarity of the structure. This growth may be performed by molecular beam epitaxy (MBE) which leads to thin (200 Å) defect layer 110 at the GaAs to silicon interface but single crystal GaAs 104 over this interface and polycrystalline GaAs 106 over oxide 108. See FIG. 1 for a cross sectional elevation view through one of the recesses. Note that the known methods primarily use a silicon substrate 102 that is tilted a few degrees from the (100) orientation of the preferred embodiment; the preferred embodiment thus permits better quality silicon devices. The MBE growth is typically about 600 degrees C. followed by an anneal at up to 900 degrees C., although the anneal may be omitted if the portion of the GaAs adjacent the surface (and which will be the channel layer for MESFETs) is doped during the MBE growth.

Figure 3A:
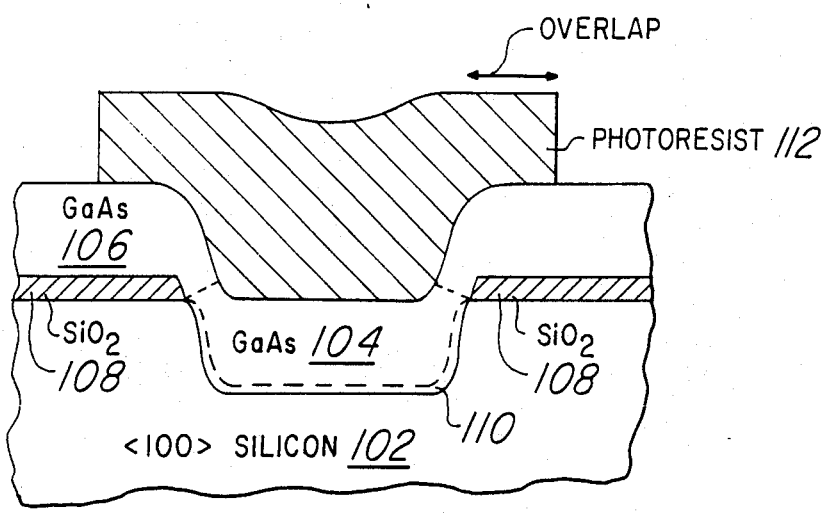
FIGS. 3a–d are cross sectional elevation views of steps of a first preferred embodiment method.
Figure 3B:
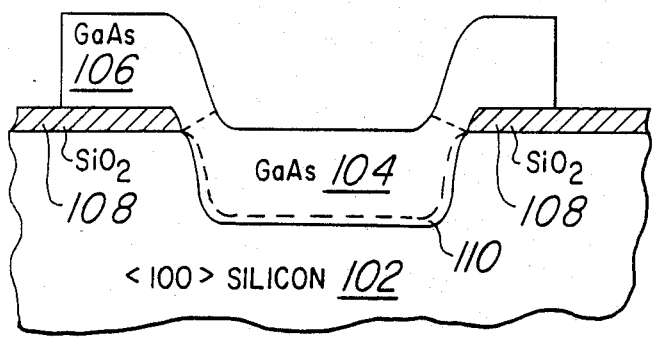

(b) Spin photoresist 112 onto the GaAs 104–106 layer, and pattern photoresist 112 to cover the recesses with an overlap over oxide 108 of about two to five microns; see FIG. 3a.

(c) Etch GaAs 104–106 layer with patterned photoresist 112 as etch mask. An anisotropic etch selective with respect to oxide 108 such as a plasma of $CCl_2F_2$+He or an isotropic etch selective with respect to oxide 108 such as a solution of $H_2O_2$+$NH_4OH$ in water or $H_2O_2$+$H_2SO_4$ in water may be used; the isotropic etch is useful despite etching part of GaAs 106 under the photoresist 112 mask because of the large overlap of photoresist 112 over oxide 108. Strip photoresist 112. See FIG. 3b.

Figure 3C:
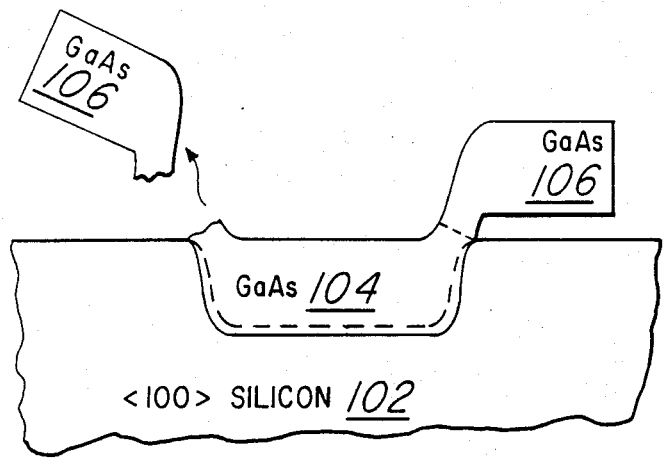

(d) Etch oxide 108 with BELL2 (a solution of HF+$NH_4F$ in water). This etch is selective with respect to GaAs and silicon and removes oxide 108 even from under GaAs 106. This etching either lifts-off GaAs 106 by fracturing the GaAs 104–106 layer at the thin neck 114 or leaves GaAs 106 cantilevered over substrate 102; both are illustrated in FIG. 3c.

Figure 3D:
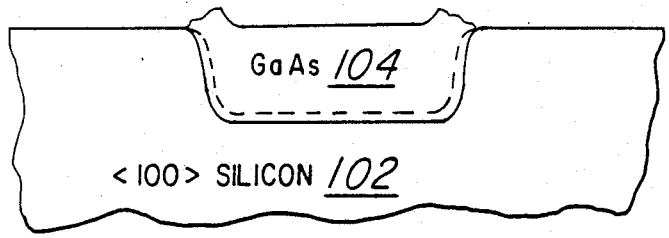

(e) Apply an ultrasonic rinse to fracture and remove cantilevered GaAs 106 at the thin neck 114 to yield a planar surface as shown in FIG. 3d.

Figure 4A:
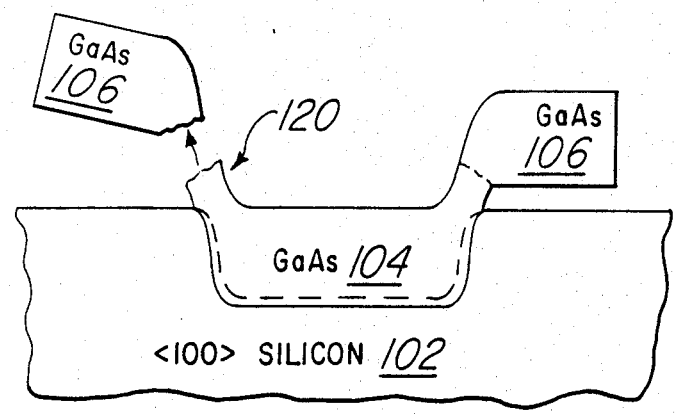
FIGS. 4a–c are cross sectional elevation views of steps of a second preferred embodiment method.

A second preferred embodiment method follows the steps (a) through (e) of the first preferred embodiment method, but applies when GaAs 106 that lifts-off fractures along a more vertical line and leaves GaAs projection 120 as illustrated in FIG. 4a. The location of the fracture line depends upon the thickness of GaAs layer 106, the thickness of oxide 108, and the amount of photoresist 112 overlap over oxide 108. The fracture line for cantilevered GaAs 106 is similar after application of an ultrasonic rinse. The second preferred embodiment method then proceeds as follows.

Figure 4B:
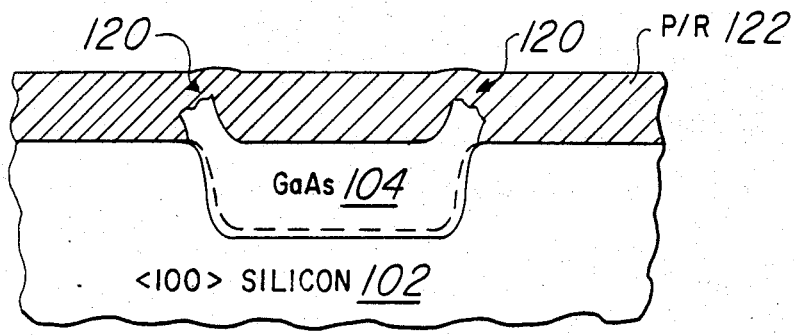

(f) Spin on photoresist 122 to a thickness of about one micron, soft-bake resist 122 to drive off solvents, then postbake (not development is needed) to flow resist 122 and planarize it over projections 120; see FIG. 4b.

Figure 4C:
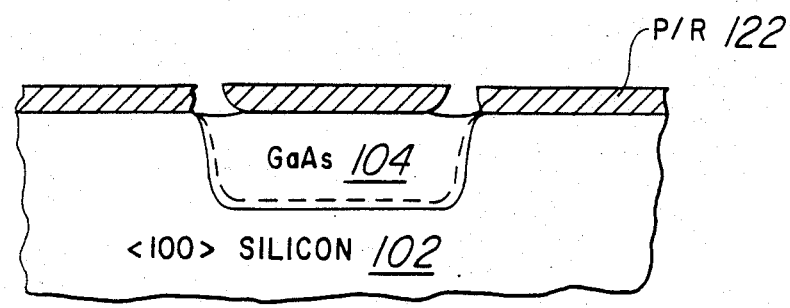

(g) Etch resist 122 in an oxygen plasma until projections 120 are exposed. Then etch projections 120 with an isotropic GaAs etch such as a solution of $H_2O_2 + NH_4OH$ in water or $H_2O_2 + H_2SO_4$ in water. The etch is timed to stop about level of substrate 102/GaAs 104. See FIG. 4c. Lastly, strip resist 122.

The formation of GaAs 104 in recesses in substrate 102 by the preferred embodiment methods and standard GaAs processing are relatively low temperature processes, usually below 800 degrees C. to prevent arsenic out-diffusion, so circuitry formed in the silicon surface regions of substrate 102 away from GaAs 104 could include materials such as silicides and tungsten. After formation of GaAs regions 104, devices such as MESFETs and JFETs may be fabricated in GaAs regions 104 by standard processing, and the GaAs devices interconnected to the circuitry formed in silicon substrate 102 away from GaAs 104. Any aluminum or gold metallization would be applied after devices had been fabricated in GaAs 104.

Figure 5:
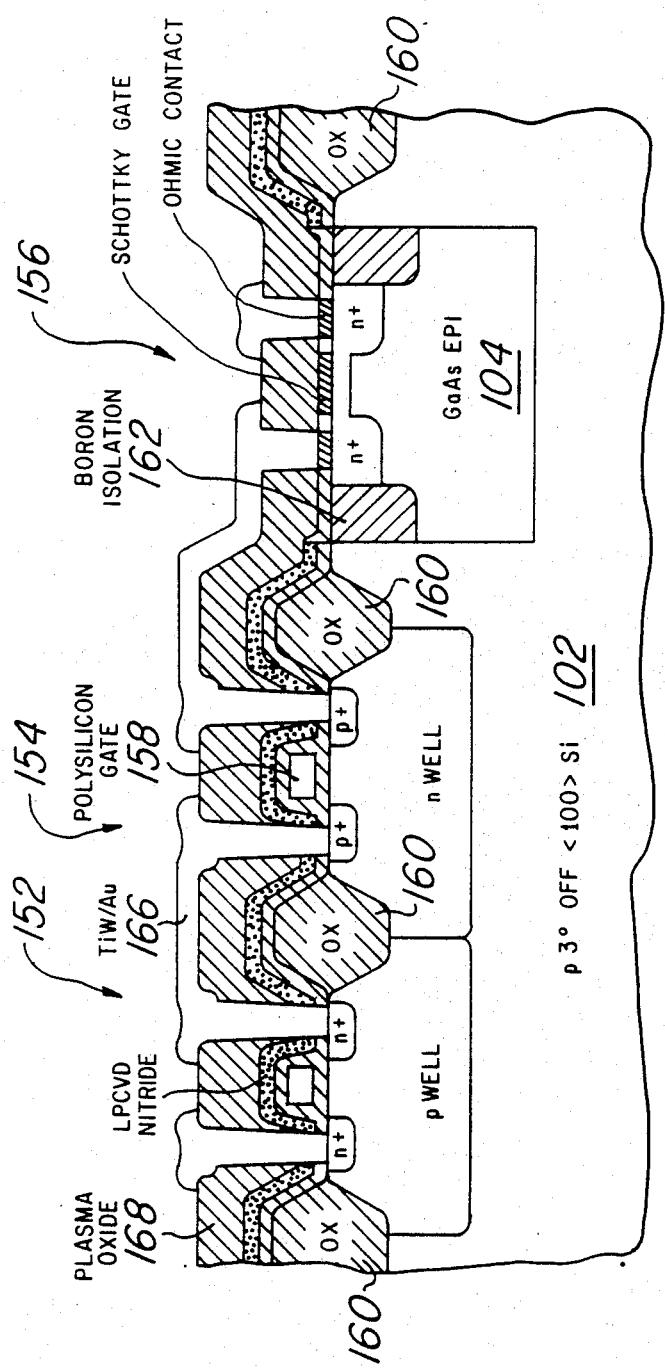
FIG. 5 illustrates in cross sectional elevation view interconnected silicon and gallium arsenide devices.

FIG. 5 illustrates MOSFETs 152 and 154 in silicon substrate 102 interconnected to MESFET 156 in single crystal GaAs 104. The structure of FIG. 5 is simplified in order to show both standard twin-well CMOS devices with polysilicon gates 158 and field oxide 160 isolation together with an n-channel MESFET with boron lattice-damage isolation 162 in GaAs 104. After the CMOS processing steps of polysilicon gate formation and source/drain implantation and anneal, the wafer is covered by about 3,000 Å of $SiO_2/Si_3N_4/SiO_2$ with the nitride inserted to prevent gallium diffusion during the MBE growth of the GaAs. As with the first preferred embodiment method, windows are opened in the oxide/nitride/oxide and recesses three $\mu$m deep are etched in the silicon substrate by RIE. After MBE growth of GaAs, the GaAs outside of the recesses is removed by the first preferred embodiment method. MESFETs are then formed by standard recessed gate processing with Ti/Pt/Au Schottky gate and Au/Ge/Ni ohmic source/drain contacts. Ti:W/Au metallization 166 with plasma oxide 168 insulator interconnects the CMOS (or other silicon devices) with the MESFETs (or other GaAs devices). Further interconnections, passivation, bonding, and packaging completes the chip.

MODIFICATIONS AND ADVANTAGES

Various modifications of the preferred embodiment devices and methods may be made while retaining the features of a noncritical photolithographic removal of the grown layer followed by a lift-off the remainder of the unwanted portion of the grown layer yielding a planar structure.

For example, other semiconductor materials may be used for growing layers, such as other III-V compounds including ternary $Al_xGa_{1-x}As$ and $In_xGa_{1-x}As$ or quarternaries or even II-VI compounds; the recessed material may be other materials such as siliconon-insulator, germanium, compound semiconductors, or other comples structure including a heavily doped silicon substrate with a lightly doped epilayer containing p and n wells for CMOS devices and bipolar regions together with trench isolation between the regions as in BiCMOS; the growth of the semiconductor in the recesses could be by metalorganic chemical vapor deposition (MOCVD), metalorganic MBE (MOMBE), low pressure CVD, sputtering, and so forth; the grown layer may be a stack of sublayers such as GaAs and $Al_xGa_{1-x}As$ to permit fabrication of heterojunction bipolar transistors, the dimensions and shapes of the recesses may be varied such as some deep recesses that are filled by a second application of the preferred embodiment methods; and various crystal-defect improvement techniques such as growth of superlattices near the heterointerface could be incorporated into the recess-filling growth.

The invention provides the advantage of planar regions of a first semiconductor in a layer of a second semiconductor.

What is claimed is:

1. A method of heteroepitaxial semiconductor fabrication, comprising the steps of:
   (a) form at least one masked recess in a first layer of a first semiconductor material;
   (b) deposit a second layer of a second semiconductor material different from said first semiconductor material on said masked, recessed first layer, said second layer of thickness approximately equal to the depth of said recess(es);
   (c) remove said second layer except over said recess(es) plus adjacent regions at most five microns away; and
   (d) remove said mask and thereby lift-off substantially all of the remainder of said second layer outside of said recess(es).

2. The method of claim 1, further comprising the step of:
   (a) apply vibrations to the product of step (d) and thereby remove any remaining portions of said second layer outside of said recess(es).

3. The method of claim 1, wherein:
   (a) said first semiconductor material is silicon; and
   (b) said second semiconductor material is $In_x Al_y Ga_{1-x-y} As$ for various nonnegative x, y values in the range of $0 \leq x + y \leq 1.0$.

4. The method of claim 1, wherein:
   (a) said first semiconductor material is silicon;
   (b) said second semiconductor material is GaAs;
   (c) said mask is silicon dioxide; and
   (d) said removal in step (c) is by photolithography.

5. A method of heteroepitaxial semiconductor fabrication, comprising the steps of:
   (a) form at least one masked recess in a first layer of a first semiconductor material;
   (b) deposit a second layer of a second semiconductor material different from said first semiconductor material on said masked, recessed first layer, said second layer of thickness approximately equal to the depth of said recess(es);
   (c) remove said second layer except over said recess(es) plus adjacent regions at most five microns away.;
   (d) remove said mask;
   (e) form a planar layer on said first layer plus the remainder of said second layer with the portions of said remainder projecting above the plane of said first layer also projecting through said planar layer;
   (f) remove said portions using said planar layer as a mask; and
   (g) remove said planar layer.

6. The method of claim 5, further comprising the step of:
   (a) apply vibrations to the product of step (d) prior to formation of said planar layer.

7. The method of claim 5, wherein:
(a) said first semiconductor material is silicon; and
(b) said second semiconductor material is $In_xAl_yGa_{1-x-y}As$ for various nonnegative x, y values in the range of $0 \leq x+y \leq 1.0$.

8. The method of claim 5, wherein:
(a) said first semiconductor material is silicon;
(b) said second semiconductor material is GaAs;
(c) said mask is silicon dioxide;
(d) said planar layer is photoresist; and
(e) said removal in step (c) is by photolithography.

9. The method of claim 5, wherein:
(a) said formation in step (e) is by spinning on photoresist followed by etchback to expose said portions.

10. A method of heteroepitaxial fabrication of an integrated circuit, comprising the steps of:
(a) form devices in a first layer of a first semiconductor material;
(b) form at least one masked recess in said first layer;
(c) deposit a second layer of a second semiconductor material different from said first semiconductor material on said masked, recessed first layer, said second layer of thickness approximately equal to the depth of said recess(es);
(d) remove said second layer except over said recess(es) plus adjacent regions at most five microns away;
(e) remove said mask;
(f) form devices in said second layer part over said recess(es);
(g) form electrodes for and interconnections among said devices in said first layer and in said second layer part; and
(h) package said first layer and second layer part plus devices and electrodes and interconnections.

11. The method of claim 10, comprising the further steps of:
(a) after step (e) form a planar layer on said first layer plus the remainder of said second layer with the portions of said remainder projecting above the plane of said first layer also projecting through said planar layer;
(b) remove said portions using said planar layer as a mask; and
(c) remove said planar layer.

12. The method of claim 11, further comprising the step of:
(a) apply vibrations to the product of step (e) prior to formation of said planar layer.

13. The method of claim 10, wherein:
(a) said first semiconductor material is silicon; and
(b) said second semiconductor material is $In_xAl_yGa_{1-x-y}As$ for various nonnegative x, y values in the range of $0 \leq x+y \leq 1.0$.

14. The method of claim 11, wherein:
(a) said first semiconductor material is silicon;
(b) said second semiconductor material is GaAs;
(c) said mask is silicon dioxide;
(d) said planar layer is photoresist; and
(e) said removal in step (d) is by photolithography.

15. The method of claim 10, wherein:
(a) said formation in step (e) is by spinning on photoresist followed by etchback to expose said portions.

* * * * *